United States Patent [19]

Dlouhy

[11] Patent Number: 4,793,102
[45] Date of Patent: Dec. 27, 1988

[54] METHOD OF PRODUCING A BEVELED PERIPHERAL PROFILE ON A SEMICONDUCTOR DISC

[75] Inventor: Jiri Dlouhy, Mägenwil, Switzerland

[73] Assignee: BBC Brown Boveri AG, Baden, Switzerland

[21] Appl. No.: 104,224

[22] Filed: Oct. 5, 1987

[30] Foreign Application Priority Data

Oct. 13, 1986 [CH] Switzerland .................. 4070/86

[51] Int. Cl.⁴ .................. B24B 1/00; B24B 9/06
[52] U.S. Cl. .................. 51/283 E; 51/289 R
[58] Field of Search ............ 51/283 E, 283 R, 284 E, 51/289 R, 105 LG, 105 SP, 327, 106 R, 106 LG

[56] References Cited

U.S. PATENT DOCUMENTS

| | | | |
|---|---|---|---|
| 2,782,565 | 2/1957 | Jones | 51/289 R |
| 3,262,234 | 7/1966 | Roach | 51/320 |
| 4,031,667 | 6/1977 | Sehestedt | 51/106 R |
| 4,227,347 | 10/1980 | Tam | 51/235 |
| 4,580,368 | 4/1986 | Smith | 51/289 R |

FOREIGN PATENT DOCUMENTS

| | | | |
|---|---|---|---|
| 1539101 | 6/1969 | Fed. Rep. of Germany . | |
| 1589421 | 6/1970 | Fed. Rep. of Germany . | |
| 2807268 | 8/1979 | Fed. Rep. of Germany | 51/284 E |
| 2437271 | 4/1980 | France . | |
| 57-26439 | 2/1982 | Japan . | |
| 0143948 | 8/1983 | Japan | 51/281 SF |
| 58-202758 | 11/1983 | Japan . | |
| 59-224250 | 12/1984 | Japan . | |
| 0435926 | 11/1974 | U.S.S.R. | 51/105 LG |

Primary Examiner—Frederick R. Schmidt
Assistant Examiner—Robert A. Rose
Attorney, Agent, or Firm—Oblon, Fisher, Spivak, McClelland & Maier

[57] ABSTRACT

In a method of producing a beveled peripheral profile on a semiconductor disk (1), the peripheral profile is ground by an obliquely-arranged grinding disk (7). The centering of the semiconductor disk (1) in the clamping device, consisting of clamping heads (3, 6), preferably occurs via a bonded-on molybdenum disk (2), which runs on a guide disk (9). The employment of a diamond grinding disk with suitable grains and binder is particularly appropriate.

8 Claims, 1 Drawing Sheet

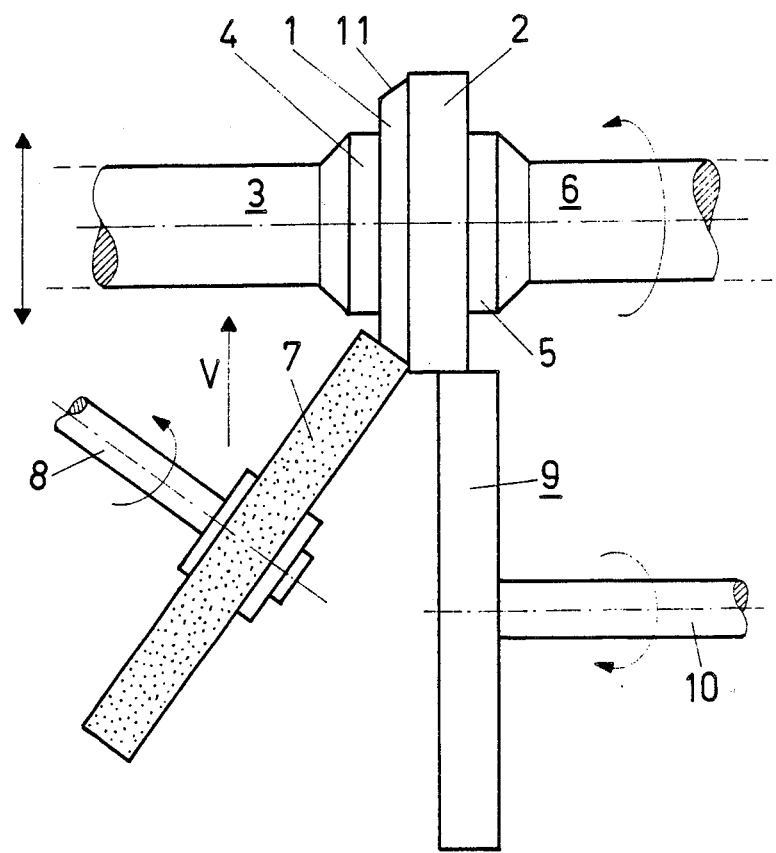

METHOD OF PRODUCING A BEVELED PERIPHERAL PROFILE ON A SEMICONDUCTOR DISC

1. Technical field

The invention relates to the field of the technology of power semiconductors. It relates particularly to a method of producing a beveled peripheral profile on a semiconductor disk, especially for medium and high voltage diodes.

2. State of the art

It has been known for a long time, in high-blocking power semiconductor components, especially in medium and high voltage diodes with alloy contact, to provide the semiconductor disk which is the basis of the component with a suitably beveled peripheral profile (so-called "positive angle"), in order to reduce the strength of electric field on the surface and obtain approximately a dielectric strength such as is suggested by the bulk properties.

In the state of the art, such a beveled peripheral profile has been made in various ways. Thus, for example, in German Pat. No. 1,589,421 there is a proposal to produce the peripheral profile on the semiconductor disk by means of an ultrasonic tool, for example an ultrasonic drill.

Another method, known from U.S. Pat. No. 3,262,234, employs a sand jet method for the profiling.

Finally, in German Accepted Application No. 1,539,101 passing mention is made that a sand jet procedure or a grinding procedure could be employed for the beveling of an edge on a semiconductor element, without however giving fuller details about a method which can be performed in practice.

The ultrasonic drilling method mentioned is relatively early in the production of semiconductors, and also has been extensively superseded by the sand jet process, because in the former method frequent damage has occurred to the crystal lattice and also eruptions in the periphery of the semiconductor disk.

The sand jet method in turn has the following disadvantages for quantity production:

- the tolerances of the sand jet process are poorly reproducible;
- the wear and tear of the sand jet apparatus, especially of the nozzles, is very great. But maintenance and repairs are extraordinarily cost-intensive;
- the processing time, and hence the capacity of a production line, depend very much on the thickness of the semiconductor disks.

Despite the disadvantages cited, the sand jet process has been extensively employed up to now, because better and practically-tested profiling processes were not available.

DESCRIPTION OF THE INVENTION

Now the purpose of the invention is to set out a method of producing a beveled peripheral profile, which can be performed simply, produces reproducible results, and requires a relatively slight technical outlay.

The purpose is met in a method of the kind stated initially, in that the semiconductor disk is rotatably clamped in the plane of grinding, and the peripheral profile is ground on the semiconductor disk by the working face of a rotating grinding disk, the grinding disk axis of which is arranged at a corresponding angle to the axis of rotation of the clamped semiconductor disk.

Thus the heart of the invention lies in the idea of grinding the beveled peripheral profile on the semiconductor disk by the purely mechanical means of a grinding disk, while a very definite geometry of the grinding device is maintained.

According to a preferred embodiment, before the clamping, the semiconductor disk is bonded onto a molybdenum disk, and the laminate consisting of the semiconductor disk and the molybdenum disk is clamped together for grinding. In this way the mechanical loads on the semiconductor disk during the grinding can be considerably reduced.

According to a further preferred embodiment, a diamond grinding disk is used as the grinding disk, diamond grains being present with a mean diameter of 25 $\mu$m in a concentration of about 3.3 carat/cm$^3$ and in a metal binder. With such a grinding disk, extremely uniform peripheral bevels can be obtained, to close tolerances, with a good working life.

SHORT DESCRIPTION OF THE DRAWING

The invention will be explained in more detail below in conjunction with the drawing, with reference to embodiments.

The single FIGURE of the drawing shows the geometrical arrangement of a grinding device, such as can be used for performing the method according to a preferred embodiment of the invention.

METHOD OF PERFORMING THE INVENTION

In the single FIGURE there is shown schematically a grinding device, with which a beveled peripheral profile can be ground on a semiconductor disk.

For this purpose the semiconductor disk 1 is preferably first bonded onto a molybdenum disk 2, which also constitutes the alloy contact of the finished component.

The laminate consisting o the semiconductor disk 1 and the molybdenum disk 2 is then, as shown in the figure, clamped between two clamping heads 3 and 6 with respective clamping jaws 4 and 5. The clamping heads 3 and 6 are rotatably journaled, so that the clamped semiconductor disk 1 can be rotated during the grinding operation.

A grinding disk 7 on a grinding disk axis 8 is arranged at an angle to the axis of rotation of the clamping device constituted by the clamping heads 3 and 6, and is so aligned that it can grind the desired peripheral bevel on the semiconductor disk 1 by means of its working face. The angle of the peripheral bevel is determined by the angle between the axis of rotation of the clamping device and the grinding disk axis 8.

In order to be able to provide the semiconductor disk 1 with a uniform peripheral profile over the entire circumference, with a clamping device with a stationary axis of rotation, it would be necessary to center the semiconductor disk 1 exactly, when clamping. This centering operation, time-consuming and prone to error, can be avoided if a clamping device is used which (as indicated in the figure by the double arrow) is movable perpendicularly to the axis of rotation.

Then, after the clamping, the clamped molybdenum disk 2 is brought with its periphery into contact with a rotatable guide disk 9, the guide disk axis 10 of which occupies a fixed position.

If, now, the molybdenum disk 2 rolls against the guide disk 9 during the grinding, then it, and hence also the semiconductor disk 1, runs true relatively to the grinding disk 7, even if it is not clamped centrally in the clamping device. The absence of centering during clamping then makes itself apparent in that the clamping heads 3, 6 perform an oscillating movement in the direction of the double arrow.

During the grinding operation, the grinding disk 7 is moved with a feed V in the direction towards the semiconductor disk 1 (indicated in the figure by the single arrow). With the diamond grinding disk described more fully below, a feed V of 4 mm/min is preferably chosen, in order to obtain short processing times at the same time as good surface properties.

For mass production of silicon diodes with blocking voltages of 300 V to 6000 V and thicknesses of the semiconductor disks of 200 μm to 1000 μm, a diamond grinding disk with the following properties has proved reliable:

the grinding disk has diameter of about 150 mm;
it contains diamond grains with a mean diameter of 25 μm;
the concentration of the diamond grains amounts to about 3.3 carat/cm$^3$ (C75); and
the diamond grains are present in the grinding disk in a metal binder;

With this reliable grinding disk, grinding is preferably performed with a cutting speed of about 22 m/s. It has proved particularly suitable to rotate the semiconductor disk 1 in this case during grinding, at about 309 revs/min in the opposite direction to the grinding disk 7.

As cooling fluid one preferably uses plain water, to which a rust preventative is added for protection of the grinding device.

Altogether, with the invention a method is available which guarantees exactly reproducible shape and tolerances of the positive angle (peripheral bevel),
does not make the capacity of the apparatus dependent on the thickness of the semiconductor disk, and
makes a low frequency of breakdown and limited maintenance of the apparatus possible.

I claim:

1. Method, especially for medium and high voltage diodes, of producing a beveled peripheral profile on a semiconductor disk having a disk plane, comprising the steps of:

bonding said semiconductor disk onto a molybdenum disk, thereby creating a two-disk assembly;
clamping said two-disk assembly in a clamping device rotatable about an axis of rotation perpendicular to said disk plane, and being movable perpendicularly to said axis of rotation;
centering said two-disk assembly by letting a periphery of said molybdenum disk roll against a rotatable guide disk having a guide disk axis, said guide disk axis having a fixed position; and
grinding said peripheral profile by means of a rotating grinding disk having a grinding disk axis, said grinding disk axis being arranged at an angle to said axis of rotation corresponding to the beveled peripheral profile.

2. Method according to claim 1, wherein a diamond grinding disk is used as said grinding disk.

3. Method according to claim 2, wherein said diamond grinding disk contains diamond grains with a mean diameter of 25 μm, said diamond grains having a concentration of about 3.3 carat/cm$^3$, and being present in said grinding disk in a metal binder.

4. Method according to claim 1, wherein said diamond grinding disk has a diameter of about 150 mm.

5. Method according to claim 3, wherein the grinding step is performed with a cutting speed of about 22 m/s.

6. Method according to claim 1, wherein, during said grinding step, said grinding disk is moved parallel to said disk plane and in the direction of said semiconductor disk with a velocity of about 4 mm/min.

7. Method according to claim 1, wherein during said grinding step, said two-disk assembly is rotated in a direction opposite to said grinding disk with a velocity of about 30 revs/min.

8. Method according to claim 2, including the step of applying water as a cooling fluid during said grinding step.

* * * * *